United States Patent [19]

Moeller et al.

[11] Patent Number: 4,543,443

[45] Date of Patent: Sep. 24, 1985

[54] METHOD FOR MANUFACTURING FINGER ELECTRODE STRUCTURES FORMING ELECTRIC CONTACTS AT AMORPHOUS SILICON SOLAR CELLS

[75] Inventors: Matthias Moeller; Helmold Kausche, both of Munich, Fed. Rep. of Germany

[73] Assignee: Siemens Aktiengesellschaft, Berlin & Munich, Fed. Rep. of Germany

[21] Appl. No.: 523,597

[22] Filed: Aug. 16, 1983

[30] Foreign Application Priority Data

Nov. 19, 1982 [DE] Fed. Rep. of Germany ....... 3242791

[51] Int. Cl.[4] ...................... H01L 31/04; H01L 31/18
[52] U.S. Cl. ...................... 136/256; 29/572;
29/591; 357/30; 357/71; 136/258; 427/74;
427/89; 427/91; 427/340; 427/404
[58] Field of Search .......................... 29/572, 589–591;
427/74, 89, 91, 250, 255.7, 404, 383.3, 337, 340;
136/256, 258 AM; 357/30, 71

[56] References Cited

U.S. PATENT DOCUMENTS 4,387,116 6/1983 Bucker .................................. 427/75
4,417,092 11/1983 Moustakas et al. ......... 136/258 AM

FOREIGN PATENT DOCUMENTS 2411690 6/1977 Fed. Rep. of Germany .
1497741 1/1978 United Kingdom ................ 136/256

Primary Examiner—Aaron Weisstuch
Attorney, Agent, or Firm—Hill, Van Santen, Steadman & Simpson

[57] ABSTRACT

A method for manufacturing finger type electrode structures which form electric contacts at solar cells consisting of amorphous silicon. The substrate is first coated with a chromium-nickel layer and then a substantially pure nickel layer. After immersion in a mildly activated fluxing agent, a tin alloy layer is applied by dipping. The method enables the manufacture of very low resistance contact fingers at a p-i-n type solar cell provided with an ITO (In/Sn/oxide) layer.

8 Claims, 3 Drawing Figures

METHOD FOR MANUFACTURING FINGER ELECTRODE STRUCTURES FORMING ELECTRIC CONTACTS AT AMORPHOUS SILICON SOLAR CELLS

BACKGROUND OF THE INVENTION

1. Field of the Invention

This invention is in the field of manufacturing electrode structures for solar cells which consist of amorphous silicon layers, the electrodes being deposited in the form of fingers with the use of masks.

2. Description of the Prior Art

In German AS No. 24 11 690 there is disclosed a method for the manufacture of electrode structures for monocrystalline silicon bodies wherein 1 micron thick silver layers were deposited by vapor deposition processes. Such solar cells consisting of monocrystalline silicon are relatively expensive so that the additional price of adding vapor deposited silver is not too significant. It would be highly desirable to provide a low-cost solar cell using amorphous silicon as a semiconductor material for the solar cells. Such cells would be considerably less expensive and the price of the finger electrodes for leading away the current forms a significant part of the expenditure.

SUMMARY OF THE INVENTION

The present invention provides an improved method of manufacturing finger type electrode structures for solar cells consisting of amorphous silicon to provide low resistance contacts and a reduced manufacturing price. The invention is particularly applicable to solar cells of the type p-i-n/ITO (indium-tin-oxide) since no deterioration of the ITO layer which serves as the anti-reflex layer occurs during the manufacture of the contacts, and the component is not thermally loaded.

Basically, the present invention provides a method in which an amorphous silicon substrate is first given a layer of a chromium-nickel alloy by vapor deposition, followed by a vapor deposition of a substantially pure nickel layer. After removal of the vapor deposition mask, the thus coated substrate is immersed into a mild activated rosin fluxing agent. Subsequently, the treated structure is immersed into a dip-tinning melt consisting of a tin alloy which is molten in the range from 210° through 230° C.

The tinning melt preferably consists of tin and lead in the weight ratio of approximately 3:2 and has a 2% silver concentration by weight. This type of bath has a temperature during tin plating of about 220° C.

As compared with known vapor deposition methods employing silver, the dip-tinning method of the present invention utilizing a nickel-chromium layer and a nickel layer as the base for tinning provides a low resistance contact at a reasonable price. For the purpose of promoting adhesion, it is desirable to vapor deposit a chromium-nickel layer having a composition of 20 to 80 weight percent chromium to nickel and a layer thickness of 100 nm and then to vapor deposit a layer of nickel of 150 through 200 nm in thickness and preferably 170 nm to provide a solderable layer. In order to prevent oxidation of the nickel layer, it is desirable to employ an additional silver layer over the substantially pure nickel layer, the silver being vapor deposited to a thickness of about 100 nm.

The flux employed is preferably a mild activated rosin fluxing agent known commercially as "multicore 5381" put out by Multicore Ltd. This particular fluxing agent does not attack the ITO layer as do more strongly activated fluxing agents, and still provides a sufficient wetting of the nickel layer by the dip-tinning process.

In addition to the improved cost factor achieved by the present invention, there is also an optimization of the electrical values. For example, resistances of 1 ohm on the 20 mm long and 0.1 to 0.2 mm wide ridges have been observed, with a resistance of 90 milliohms on a 2 through 4 mm wide middle stay. This resistance values correspond to approximately one-third of the values which are obtained with a 1 micron thick silver layer.

BRIEF DESCRIPTION OF THE DRAWINGS

The invention will be further described in greater detail with reference to the accompanying drawings in which.

DESCRIPTION OF THE PREFERRED EMBODIMENTS

Figure 1:
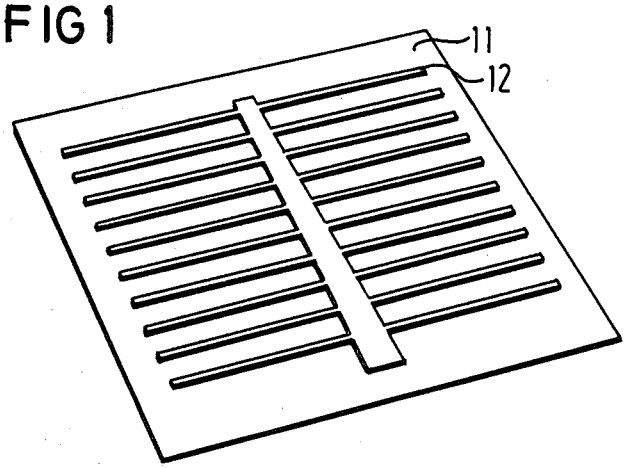
FIG. 1 is a view in perspective of a large surface p-i-n solar cell having a contact system produced according to the present invention.

The finger type electrode pattern shown in FIG. 1 is produced through the use of conventional vapor deposition masks. FIG. 1 illustrates a layered amorphous silicon substrate and reference numeral 12 indicates the finger type electrode pattern.

The first step in the process consists in vapor depositing a chromium nickel layer onto the substrate, the chromium nickel layer preferably having a composition of about 20 weight percent chromium and about 80 weight percent nickel. A suitable layer thickness of 100 nm may be provided. Next, a 150 to 200 nm, preferably 170 nm, thick substantially pure nickel layer is vapor deposited over the chromium-nickel layer previously applied and serves as a solderable layer. In order to prevent oxidation of the nickel layer, it is desirable to apply about a 100 nm thick silver layer by vapor deposition over the substantially pure nickel layer. Upon completion of the vapor coating processes, the structure is dipped into a mild activated rosin fluxing agent such as the aforementioned "multicore 5381". The structure is then dipped into a melt having a composition of about 3 parts by weight tin to 2 parts by weight lead and preferably containing about 2% by weight silver. A suitable composition includes 59% tin, 39% lead, and 2% silver. The dipping temperature for this tin-lead alloy is about 220° C. It is desirable to achieve a thickness of about 0.01 to 0.5 mm by the dip-tinning operation.

Figure 2:
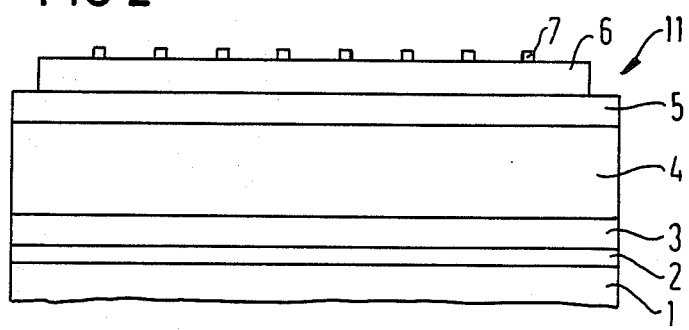
FIG. 2 is a view in cross section on a greatly enlarged scale of the structure of a solar cell for which the method of the present invention is particularly advantageous.

The drawing in FIG. 2 illustrates the overall structure of the improved solar cell of the present invention. Starting at the bottom, there is provided a substrate 1 composed, for example, of glass. Above the glass layer 1 there is back contact layer 2 consisting of aluminum/silicon or aluminum/silicon/titanium to a thickness of about 750 nm. A p-doped amorphous silicon layer of about 20 nm in thickness has been identified at reference numeral 3. An amorphous silicon layer 4 of intrinsic conductivity and measuring about 500 nm in thickness appears over the p-doped layer 3. An amorphous silicon layer 5 which is n-doped and has a thickness of about 10 nm appears over the intrinsic layer 4. An indium-tin-oxide layer 6 which serves as the anti-reflex layer is applied over the p-i-n amorphous structure. The finger electrode structure 7 consisting of a base of nickel-chromium, an intermediate layer of nickel, and an overlying layer of silver is vapor deposited on the ITO layer 6.

Figure 3:
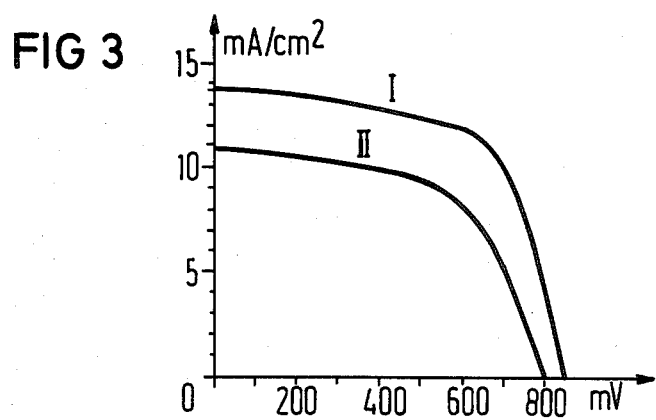
FIG. 3 is a graph plotting characteristics of the solar cell of the present invention and that of the prior art.

FIG. 3 illustrates the electrical characteristics of the improved solar cell manufactured according to the present invention under AM1 illumination (employment of a solar simulator). The cell of the present invention, represented by curve II, is free of shorts (corresponding to the slight decrease of no-load voltage with low illumination) and exhibits the same efficiency $\eta$ as cells on small surfaces (compare curve I, which was a 6 mm² cell manufactured similarly but without the electrode structure). The power loss in the electrode structure of the present invention is negligibly small. The power losses to which the resistance of the electrode grid, the center beam, and the ITO layer contribute were calculated and compared to the values which are obtained from an electrode structure having a vapor deposited silver layer of 1 micron thickness. The results are summarized in Table 1:

TABLE 1

| | Power Loss in % of the Overall Output Power | ITO | Grid | Center Beam | Overall |
|---|---|---|---|---|---|
| (a) | 0.2 mm Sn dip-tinned contact | 1.3% | 0.4% | 0.7% | 2.4% |
| (b) | 1 μm Ag vapor-deposited contact | 1.3% | 0.8% | 3% | 5.1% |

It follows that given a four-fold cell size, the contribution of the center beam would double, i.e., the overall power loss would increase when (a) and (b) are 3% and 8% respectively. This makes the employment of the dipsoldered contacts of the present invention even more advantageous.

Table 2 shows the values for efficiency $\eta$, the no-load voltage $V_{OC}$, the short-circuit current $I_{SC}$ and the fill factor FF for the solar cells identified at I and II of FIG. 3:

TABLE 2

| | I | II | |
|---|---|---|---|
| $\eta$ | 7.4 | 5 | % |
| $V_{OC}$ | 839 | 800 | mV |
| $I_{SC}$ | 13.78 | 10.9 | mA/cm² |
| FF | 64 | 57 | % |

It should be evident that various modifications can be made to the described embodiment without departing from the scope of the present invention.

We claim as our invention:

1. A method for the manufacture of finger type electrode structures forming electric contacts on solar cells consisting of amorphous silicon layers which comprises:
   vapor depositing a chromium-nickel layer over said silicon layers,
   vapor depositing a substantially pure nickel layer over said chromium-nickel layer,
   immersing the thus coated body into a fluxing agent, and dipping the coated body into a tinning bath containing a tin alloy which is molten in the range of 210° to 230° C.

2. A method according to claim 1 wherein said tinning bath has a tin to lead ratio by weight of about 3:2 and contains 2% by weight silver.

3. A method according to claim 1 wherein said chromium-nickel layer has a chromium to nickel ratio by weight of about 20 to 80 and a thickness of about 100 nm.

4. A method according to claim 1 wherein said substantially pure nickel layer has a thickness of from 150 to 200 nm.

5. A method according to claim 1 in which the deposition of the substantially pure nickel layer is followed by the vapor deposition of a silver layer having a thickness of about 100 nm.

6. A method according to claim 1 in which said dipping is carried out to achieve a tin alloy thickness of from 0.01 to 0.5 mm.

7. A solar cell structure comprising:
   a substrate comprising layers of amorphous silicon having p type, intrinsic, and n type conductivity respectively,
   an indium-tin oxide layer over said layers on the substrate, and finger type electrodes deposited on said indium-tin oxide layer, said electrodes having a base layer of a nickel-chromium alloy, an intermediate layer of substantially pure nickel, and an outer layer of a tin-lead-silver solder alloy.

8. A solar cell according to claim 7 which also includes a layer of silver immediately above the substantially pure nickel layer.

* * * * *